May 13, 1958 W. MILWITT 2,834,877

AUTOMATIC GAIN CONTROL CIRCUITS

Filed April 14, 1955

INVENTOR.
William Milwitt
BY
[signature]
ATTORNEY

United States Patent Office 2,834,877

Patented May 13, 1958

2,834,877

AUTOMATIC GAIN CONTROL CIRCUITS

William Milwitt, Reseda, Calif., assignor to Radio Corporation of America, a corporation of Delaware Application April 14, 1955, Serial No. 501,423

5 Claims. (Cl. 250—20)

Figure 1:
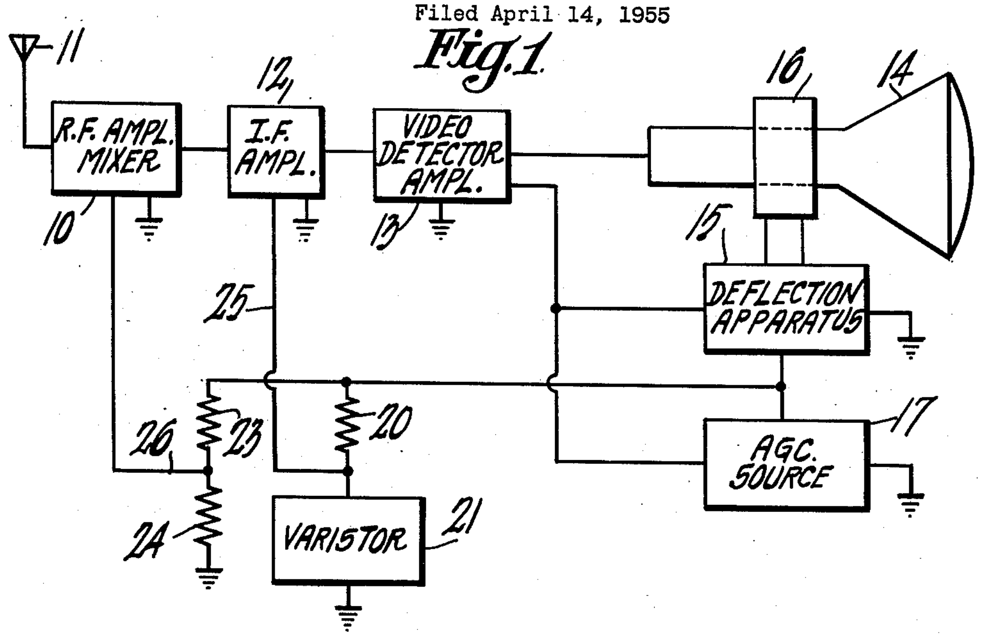

The present invention relates to systems for translating signals of variable maximum amplitude or intensity and for developing a control signal suitable for controlling the operating characteristics of the system in accordance with the intensity of the translated signal and particularly to an improved automatic gain control circuit for effectively controlling different parts of the system to a different degree and at a different rate.

It has been found that the application of the same or equal automatic gain control voltages to the first radio frequency (R.-F.) signal amplifier stage and subsequent signal amplifier stages of a receiving system may result in overloading one or more of the signal amplifier stages on the reception of strong signals, and it has also been found that the noise factor of the receiving system degrades with increasing bias principally on the first signal amplifier stage.

These disadvantages may be reduced or overcome by providing an automatic gain control system wherein substantially no voltage is applied to the first signal amplifier stage until the signal is strong enough to appreciably override all noise.

For signals stronger than necessary to override all noise, the bias voltage applied to the first signal amplifier stage is rapidly increased so that for very strong signals, the bias may be greater than that applied to the subsequent signal amplifier stage or stages. Systems of this type, which may be referred to as having a delayed automatic gain control voltage applied to the first signal amplifier stage relative to the subsequent signal amplifier stage or stages may be sensitive, to an undesirable degree, to variations in the component values and reference voltages of the system and accordingly may require manual adjustment in order to compensate for these variations.

It is accordingly an object of the present invention to provide an improved automatic gain control circuit for applying accurately controlled automatic gain control voltages of different magnitudes and at different rates to different portions of a radio receiving system while the circuit is less vulnerable to component value or supply voltage variations than some prior art systems.

It is a further object of the present invention to provide an automatic gain control circuit wherein maximum sensitivity of a radio receiving system may be accurately maintained during low signal level conditions and whereby the gain of the radio receiving system may be appropriately altered as an inverse function of the signal level to prevent overload of a portion of the receiving system while utilizing a minimum of circuit components and which is not unduly sensitive to component value variations.

It is another object of the present invention to provide a simple, efficient and inexpensive automatic gain control system for controlling the various portions of a radio receiving system to a different degree whereby a favorable noise factor and sensitivity may be maintained within useful limits irrespective of rather large changes in component values and supply voltages.

In accordance with the present invention, a voltage or current controlled variable impedance voltage divider network is utilized as an automatic gain control voltage source for either or both of the first or subsequent signal amplifier stages of a receiving system. The variable impedance is controlled as a non-linear function of the voltage or current thereby permitting maximum variation and delay to the first signal amplifier stage; and as the variable impedance which forms only a part of a plural voltage divider arrangement, provides a compensating effect, the system is less sensitive to component value and supply voltage variations than some prior art arrangements.

Figures 2, 3, 4:
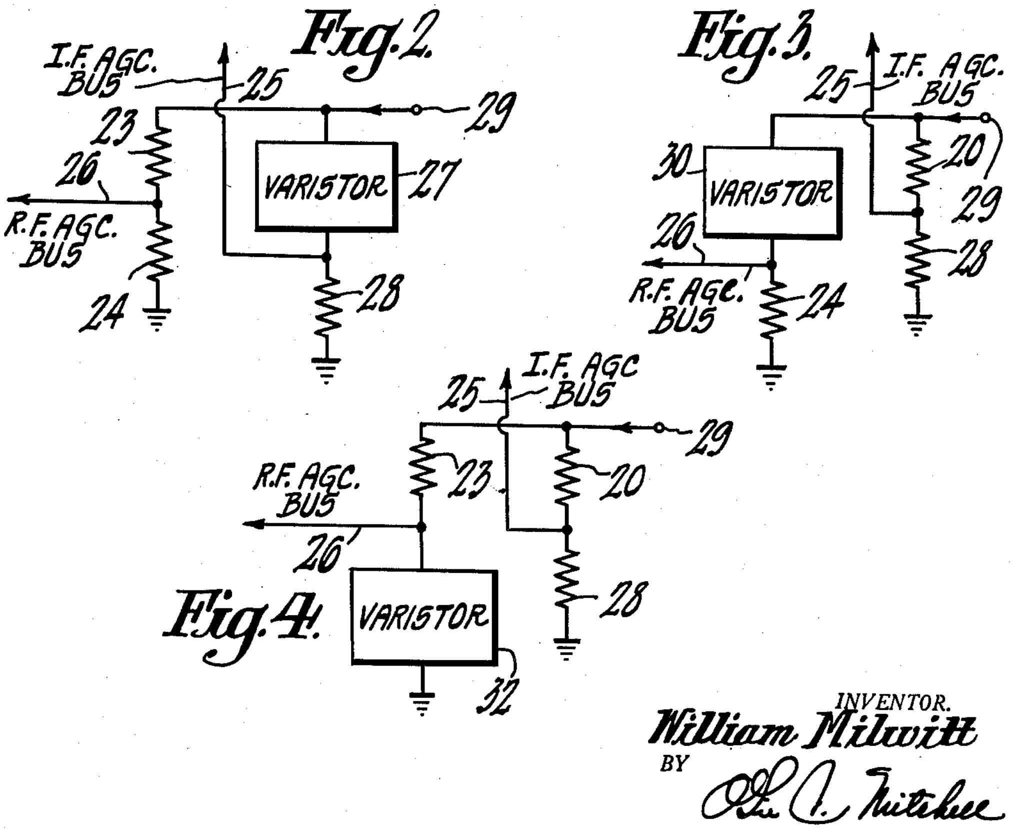

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Figure 1 is a diagrammatic representation, partly in block form, of a radio receiving system embodying an automatic gain control circuit in accordance with the present invention; and, Figures 2, 3 and 4 are schematic circuit diagrams of further embodiments of the present invention which may be utilized in the system illustrated in Figure 1.

Referring now to the drawing, in which like reference characters are utilized to designate like components throughout the various figures, and particularly to Figure 1, there is represented schematically the image signal handling portions of a television receiving system of a conventional design and embodying the present invention. It is to be understood, of course, that the automatic gain control system provided in accordance with the present invention may be utilized with radio receiving systems in general. However, the following discussion for the purpose of illustration only, will be concerned with the use of such a system in a television receiving system.

In general, the receiving system includes a suitable radio frequency amplifier and mixer stage 10 having its input circuit connected to an antenna system 11 and having its output circuit connected to an intermediate frequency amplifier section 12. Connected in cascade with the output circuit of the intermediate frequency amplifier section 12 in the order named are a video detector and amplifier portion 13 and an image reproducing device 14 preferably of the cathode-ray type. A line scanning generator or deflection apparatus 15 is also coupled to the video detector and amplifier portion 13 and adapted to provide an energizing current to the deflection coil 16 associated with the kinescope 14. The deflection apparatus 15 may also be adapted to provide a keying signal for the automatic gain control generator 17.

The stages or units 10 through 17 inclusive may all be of conventional well-known construction so that detailed illustration and descriptions are not considered necessary. Referring briefly, however, to the operation of the system described above, television signals are intercepted by the antenna system 11 and are selected and amplified in the radio frequency amplifier and mixer portion 10 to provide a vision signal at the intermediate frequency of this system.

The intermediate frequency vision signals are applied to the intermediate frequency amplifier section 12 for further amplification and are thereafter applied to the video detector and amplifier stages to derive therefrom the video-frequency modulation components of the vision signal. The modulation components are amplified by the video-frequency amplifier and are applied in the usual manner to a brightness control electrode of the image reproducing device 14. The intensity of the electron beam of the tube 14 is thus modulated or controlled in accordance with the video-frequency voltages impressed on this control electrode in the usual manner.

The modulation components of the vision signal are also applied to a synchronizing signal apparatus wherein synchronizing components are separated from the vision signal components and the line and field synchronizing components are separated from each other and applied to respectively different portions of the deflection apparatus 15. Sawtooth current or voltage scanning waves are generated in deflection apparatus 15 and applied to the scanning elements of the cathode-ray tube 14 to produce electric scanning fields thereby to deflect the electron beam in two different directions normal to each other so as to trace a rectangular scanning pattern on the screen of the tube to reconstruct the transmitted image.

The automatic gain control voltage source 17 may be a keyed or automatic gain control system of the type, for example, described by A. R. Wendt in U. S. Patents 2,637,772, issued May 5, 1953, and 2,586,193, issued February 19, 1952, which is designed to provide automatic gain control voltages to control the degree of amplification of video modulated signals in a television receiving system in accordance with the intensity of the carrier wave received during the synchronizing or blanking intervals. A keying signal may be applied from the deflection system 15 to periodically energize the automatic gain control voltage generator 17 thereby to develop an automatic gain control voltage in accordance with the information received from the video and detector amplifier section 13. An automatic gain control voltage is, therefore, developed across the impedance network provided in accordance with the present invention.

This automatic gain control voltage is developed across a load circuit comprising the parallel arrangement of a pair of voltage divider networks. One voltage divider network includes a fixed or linear impedance element illustrated as a resistor 20, connected in series with a varistor 21.

The varistor is an element that follows the law: $I=KV^n$ where I equals current, V equals voltage and K and $n$ are constants. In Figure 1, the value of $n$ should be greater than +1 and as an example, $n$ may be approximately equal to 6.

As the input signal strength to the receiving system increases, the automatic gain control voltage which is developed across the voltage divider networks increases. The automatic gain control voltage or bias applied to the intermediate frequency stage or stages will vary as a function of the variation of the varistor impedance.

That is to say, it will not change as rapidly as the automatic gain control source voltage changes since the effective resistance of the varistor decreases as the applied voltage incerases.

This will effectively result in a delayed automatic gain control bias being applied to the radio frequency stage relative to that applied to the intermediate frequency stage. It is therefore seen, that the automatic gain control bias which is applied to the radio frequency automatic gain control bus 26 is a predetermined portion of the automatic gain control voltage developed at the source 17 as determined by the relative values of the resistors 23 and 24.

The automatic gain control bias which is applied to the intermediate frequency automatic gain control bus 25 is, at the same time, a varying proportion of the automatic gain control voltage developed at the source 17 depending on the impedance value of the varistor 21 which is in turn determined by the voltage applied to it. Due to the compensating effect of the varistor 21, the automatic gain control bias applied to each of the automatic gain control buses 25 and 26 does not vary outside useful elements in the face of relatively large variations in the resistive value of each of the resistors 20, 23 and 24 due to the compensating effect of the varistor 21.

It was above noted that the varistor 21 utilized in the embodiment of the invention illustrated in Figure 1 is one having the characteristics of providing a decreasing impedance with an increasing voltage or current. It is also within the scope of the present invention to utilize a varistor having an inverse characteristic, that is, a characteristic wherein the impedance offered by the element in the associated circuit increases with an increase of the voltage applied thereacross.

A varistor of this type may follow the law: $I=KV^n$ where I equals current, V equals voltage, K and $n$ are constants but the value of $n$ would always be less than +1. That is, $n$ could be any value between plus one and minus infinity.

This illustrated in Figure 2 wherein a varistor 27 is connected in series with a fixed direct current conductive impedance element illustrated as a resistor 28.

Accordingly, as the voltage applied to the terminal 29 from a source such as the automatic gain control source 17 (shown in Figure 1) increases, the impedance of the varistor 27 increases thereby providing a smaller portion of the automatic gain control voltage across the resistor 28 which is therefore applied to the intermediate frequency automatic gain control bus 25. The proportion of the automatic gain control voltage applied to the terminal 29 which appears at the radio frequency automatic gain control bus 26 is as discussed in connection with Figure 1, determined by the relative value of the fixed elements 23 and 24.

It is therefore seen that with an increase in the received signal strength, the automatic gain control bias which is applied to the intermediate frequency signal amplifier stage or stages of the associated radio receiving system increases at a lesser rate than does that portion of the automatic gain control voltage which is applied to the radio frequency signal amplifier stage or stages of the associated receiving system which proportion remains relative constant depending on the predetermined values of the resistors 23 and 24.

In accordance with a further aspect of the present invention, a varistor having a decreasing impedance with applied voltage or current may be utilized in the voltage divider arrangement utilized to develop the radio frequency automatic gain control voltage.

This embodiment is illustrated in Figure 3 wherein a varistor 30 having a characteristic as described in connection with the varistor 21 of Figure 1 is connected in series with a fixed direct current conductive impedance element, illustrated as a resistor 24, to provide an automatic gain control bias for the radio frequency automatic gain control bus 26. The automatic gain control bias which is applied to the intermediate frequency automatic gain control bus 25 is determined by the relative values of the resistors 20 and 28 which are connected in series between the source terminal 29 and a point of fixed reference potential or signal ground.

With this arrangement, the proportion of automatic gain control voltage which is applied to the intermediate frequency automatic gain control bus 25 is fixed by the relative values of the resistors 20 and 28. The proportion of the automatic gain control voltage applied to the radio frequency automatic gain control bus 26 is determined by the relative value of the impedance offered by the varistor 30 and the fixed value of the resistor 24. Since the impedance offered by the varistor 30 decreases with an increased applied voltage or current, it is readily seen that the proportion of the automatic gain control voltage which is applied to the radio frequency amplifier stage or stages of the associated receiving system increases with an increase in the developed automatic gain control voltage. The automatic gain control bus is therefore applied at a different rate and to a different extent to each of the two portions of the associated receiving system. Maximum sensitivity without overload of any of the portions of the system is therefore maintained under a wide range of signal strength conditions.

In Figure 4 there is illustrated an automatic gain control system provided in accordance with the present invention wherein a varistor having an inverse characteristic as described in connection with Figure 2 is utilized in the voltage divider network for providing the radio frequency automatic gain control bias. Accordingly, a varistor 32 having the characteristic of providing an increased impedance in the associated circuit with an increase in the applied voltage is connected in series with the resistor 23 between the automatic gain control source terminal 29 and signal ground. As the voltage developed by the automatic gain control source increases, the proportion of the automatic gain control voltage which is applied to the radio frequency automatic gain control device bus 26 increases as determined by the characteristic of the varistor 32. As above discussed, the proportion of the automatic gain control voltage which is applied to the intermediate frequency automatic gain control bus is determined by the fixed values and the relative values of the resistors 20 and 28.

While the specific circuits relating to combinations of two or more variable impedance elements exhibiting either or both positive or negative characteristics have not been shown, it is to be understood that it is within the scope of the present invention to provide combinations such as the intermediate frequency voltage divider branch of Figure 1 with the radio frequency voltage divider branch of either Figure 3 or 4. Other combinations including two varistors in a single voltage divider such as the varistor 27 of Figure 2 with the varistor 21 of Figure 1 may be utilized in accordance with the present invention to provide a specific type or rate of control.

The automatic gain control circuit provided in accordance with the present invention utilizes a variable impedance element or elements having a decreasing or increasing impedance characteristic or variation with applied voltage or current to provide an automatic gain control voltage for various portions of the associated receiving system in such a manner as to maintain maximum sensitivity without overload of any one portion of the system through a wide range of received signal energy. Variable impedance elements having the characteristic of providing an increased impedance with an increase in voltage or current or a variable impedance element having the characteristic providing a decrease with increased voltage or current may be utilized in various combinations in accordance with the present invention to provide these characteristics.

Having thus described the invention, what is claimed is:

1. In a signal receiving apparatus including first and second signal amplifier stages adapted to amplify received signal waves and automatic gain control voltage generating means for deriving a gain control voltage proportional to the amplitude of said received signal waves, an automatic gain control circuit comprising, a first voltage divider network including a pair of resistors connected in series between said voltage generating means and a point of fixed reference potential, circuit means connected between said second signal amplifier stage and the junction of said pair of resistors for applying a predetermined portion of said control voltage to said second signal amplifier, a second voltage divider network including a varistor and a resistor connected in series arrangement in shunt with said first voltage divider network, said varistor having the characteristic defined by $I=KV^n$ where $I$=current, $V$=voltage, K and $n$ are constants, and circuit means connected between said first signal amplifier stage and the junction of said varistor and said resistor whereby the magnitude and rate of applied control voltage to each of said signal amplifier stages is different.

2. In a signal receiving apparatus including a radio frequency signal amplifier stage and an intermediate frequency signal amplifier stage adapted to amplify received signal waves and automatic gain control voltage generating means for deriving a gain control voltage proportional to the amplitude of said received signal waves, an automatic gain control circuit comprising, a first voltage divider network including a pair of resistors connected in series between said voltage generating means and a point of fixed reference potential, circuit means connected between said intermediate frequency signal amplifier stage and the junction of said pair of resistors for applying a predetermined portion of said control voltage to said second signal amplifier, a second voltage divider network including a varistor and a resistor connected in series arrangement in shunt with said first voltage divider network, said varistor having the characteristic defined by $I=KV^n$ where $I$=current, $V$=voltage, and K and $n$ are constants, and further circuit means connected between said radio frequency signal amplifier stage and the junction of said varistor and resistor whereby the magnitude and rate of applied control voltage to each of said signal amplifier stages is different.

3. In a signal receiving apparatus including a radio frequency signal amplifier stage, an intermediate frequency signal amplifier stage and an automatic gain control voltage generating means for developing a gain control voltage proportional to the amplitude of a received carrier wave, an automatic gain control circuit comprising, a first resistor and a second resistor connected in series arrangement between said voltage generating means and a point of fixed reference potential, circuit means connected between said radio frequency signal amplifier stage and the junction of said first and second resistors for applying a predetermined portion of said control voltage to said radio frequency signal amplifier stage at a predetermined rate, a varistor having a voltage controlled negative resistance characteristic and connected in series with a third resistor between said voltage generating means and said point of fixed reference potential, and circuit means connected between said intermediate frequency signal amplifier stage and the junction of said varistor and said third resistor for applying a control voltage thereto.

4. In a television signal receiving apparatus including a radio frequency signal amplifier stage, an intermediate frequency signal amplifier stage and an automatic gain control voltage generating means for developing a gain control voltage proportional to the amplitude of a received carrier wave, an automatic gain control circuit comprising, a first resistor and a second resistor connected in series arrangement between said voltage generating means and a point of fixed reference potential, circuit means connected between said intermediate frequency signal amplifier stage and the junction of said first and second resistor for applying a predetermined portion of said control voltage to said intermediate frequency signal amplifier stage at a predetermined rate, a varistor having a voltage controlled negative resistance characteristic and connected in series with a third resistor between said voltage generating means and said point of fixed reference potential, and circuit means connected between said radio frequency signal amplifier stage and the junction of said varistor and said third resistor for applying a control voltage thereto.

5. In a television signal receiving apparatus including a radio frequency signal amplifier stage, an intermediate frequency signal amplifier stage and an automatic gain control voltage generating means for developing a gain control voltage proportional to the amplitude of a received carrier wave, an automatic gain control circuit comprising, a first resistor and a second resistor connected in series arrangement between said voltage generating means and a point of fixed reference potential, circuit means connected between said intermediate frequency signal amplifier stage and the junction of said first and second resistor for applying a predetermined portion of said control voltage to said intermediate frequency signal amplifier stage at a predetermined rate, a varistor having a voltage controlled positive resistance characteristic and connected in series with a third resistor between said voltage generating means and said point of fixed reference potential, and circuit means connected between said radio frequency signal amplifier stage and the junction of said varistor and said third resistor for applying a control voltage thereto.

References Cited in the file of this patent

UNITED STATES PATENTS

| | | |
|---|---|---|
| 1,875,157 | Roberts | Aug. 30, 1932 |
| 2,085,905 | Friederich | July 6, 1937 |
| 2,156,846 | Getaz | May 2, 1939 |
| 2,171,645 | Broos | Sept. 5, 1939 |
| 2,262,841 | Goddard | Nov. 18, 1941 |
| 2,399,968 | Whitelock | May 7, 1946 |